July 21, 1959 L. W. ERATH 2,896,171

OSCILLATOR

Filed Sept. 30, 1958

INVENTOR

Louis W. Erath

BY Burns, Doane, Benedict & Irons

ATTORNEYS

United States Patent Office 2,896,171

Patented July 21, 1959

2,896,171

OSCILLATOR

Louis W. Erath, Houston, Tex., assignor to Dresser Industries, Inc., Dallas, Tex., a corporation of Delaware Application September 30, 1958, Serial No. 764,307

14 Claims. (Cl. 331—135)

This invention relates to oscillators, and more particularly to variable frequency oscillators having a broad frequency range output.

In the past it has been very difficult to obtain oscillators which are operable over a range of frequency from, for instance, one cycle per second to 100,000 cycles per second. Moreover, oscillators operable from one cycle per second to frequencies of the order of megacycles per second are practically unheard of. The apparatus of the present invention is designed to furnish such outputs, yet with a very simple oscillator circuit. The core of the invention is the use of the combination of a vacuum tube and a transistor in an oscillator circuit, with the vacuum tube and its parameters being chosen such that the tube has extremely low grid current, preferably of the order of $10^{-12}$ amperes or less.

The preferred embodiment of the invention is an oscillator of the so-called Hewlett R-C type, a type generally disclosed in Hewlett Patent No. 2,268,872. In that type of circuit, regenerative feedback is furnished the input of an amplifier circuit at a particular frequency selected by the R-C feedback network. In addition, negative feedback is provided the input of the amplifier for stabilization purposes. Because of the adverse effects of high grid current in the input tube of the amplifier, it has not been possible to employ very large resistors in the regenerative feedback circuit of such an oscillator. Therefore, the capacitors employed had to be very large in size. Besides the disadvantage of the high cost of such capacitors, there was also the fact that dust between the capacitor plates created a high conductance path around the capacitors and in effect reduced the equivalent value of the resistors of the feedback network. Therefore, difficulty was often had in getting the Hewlett type oscillator to operate at very low frequencies, especially when the oscillator was first turned on.

The difficulties referred to above in connection with the Hewlett or R-C oscillator are avoided by use of the present invention, because of the fact that the input tube of the oscilaltor has such an extremely low grid current. With a grid current of the order of that mentioned above, it is possible to use extremely large and practically infinite resistors. Since the frequency of oscillation is determined by the reciprocal of the product of the resistance and the capacitance in the feedback network, the use of such a large value resistor permits use of a relatively small capacitor. Dust leakage becomes less important as the size of the capacitor decreases, so that the present invention practically eliminates the adverse effect of dust leakage, and also permits the use of very small and inexpensive components.

In order that the very low grid current specified above can be obtained, the present invention uses a vacuum tube stage which is effectively a voltage to current transducer. Therefore, a transistor, which is inherently a current-operated device, can be cascaded with the vacuum tube, and the inherent loss of gain in the vacuum tube stage can be compensated for by the high gain of the transistor. Moreover, the use of a transistor of the PNP type permits direct coupling between the vacuum tube and the transistor, so that the phase shift present in the usual R-C coupled circuit is eliminated. This phase shift is extremely important, as is well known, for it limits the frequency range of the oscillator. Since the circuit of this invention eliminates phase shift due to coupling, the oscillator can operate over a much broader frequency range.

The use of a transistor in this circuit also permits use of a common B supply for the tube and the transistor, since the two are complementary in effect so far as voltage drop is concerned.

The present invention also employs a direct feedback between the output and the input of the amplifier circuit for stabilization purposes, together with control of that feedback circuit to eliminate D.-C. voltage drop across the feedback resistor. The feedback, being determined only by the A.-C. output, is inherently independent of D.-C. level, so that stabilization can be obtained over a much broader range of frequencies than is usual.

Since the time constant of the degenerative feedback path has been found to be the most important limitation on the frequency band of the oscillator, we employ a thermistor having a relatively long time constant, in the feedback network.

Though the present invention has been and will be further described in conjunction with the Hewlett R-C type of oscillator, this is only the preferred embodiment of the invention, and the inventive advances of the circuit to be described may be employed in other types of oscillators. More particularly, they may be employed in the "ultrasonic" oscillator described by Louis W. Erath in Electronics for October 1953, pages 174 and 175. Also they may be employed in the Scott type of oscillator disclosed in Scott Patent No. 2,173,427.

The present invention will now be more fully described in conjunction with preferred embodiments thereof shown in the accompanying drawing.

Figure 1:
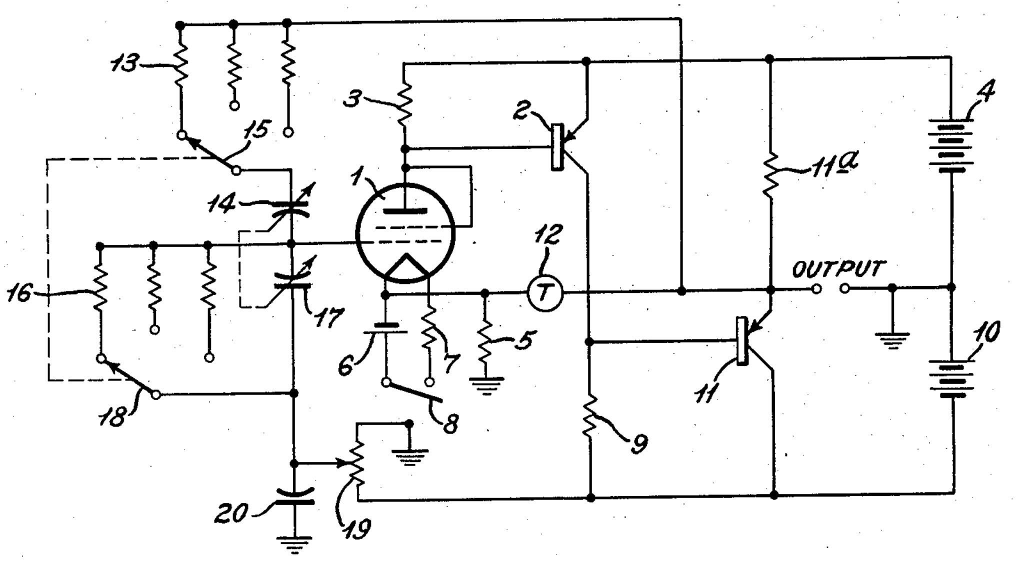
Fig. 1 is a schematic diagram of one embodiment of the invention.

Referring first to Fig. 1, the oscillator includes an amplifier comprising a vacuum tube 1 and a directly-coupled transistor 2. The vacuum tube 1 employs a low resistance plate resistor 3 connecting its plate to the positive side of a plate source 4. The tube and its circuits are selected to have an extremely low grid current, preferably of the order of $10^{-12}$ amperes, and an electrometer tube of the type designated by Raytheon as the CK–5886 has been found to be satisfactory for this purpose. The screen grid of the electrometer tube is connected directly to the plate, while the filament is connected to ground by a cathode resistor 5. The filament circuit contains the usual A battery 6, resistor 7 and switch 8.

As indicated above, the plate or anode of the vacuum tube 1 is directly connected to the transistor 2, this by means of a conductive connection to the base of the transistor. The emitter of the transistor is connected to the positive side of the plate supply 4. The collector of the transistor is connected through a resistor 9 to the negative side of a second voltage source 10. The positive side of the source 10 and the negative side of the source 4 are connected to ground.

The collector of transistor 2 is conductively connected to the base of a PNP transistor 11, the resistor 9 functioning as a common bias resistor for the two transistors.

The emitter of transistor 11 is connected to the positive side of source 4 through resistor **11*a*. The output of the oscillator is taken from the emitter circuit of transistor 11**, being available between the emitter and ground.

Degenerative feedback of the negative series type is provided by a connection from the emitter of transistor 11 to the filament or cathode of vacuum tube 1. This connection includes a stabilizing thermistor 12.

Regenerative feedback for operation of the oscillator is obtained by connection from the emitter of transistor 11 to the control grid of vacuum tube 1 through the series combination of a selected one of a plurality of resistors 13 and a variable capacitor 14. A switch 15 connected between the capacitor and the resistors selects which one of the resistors is in the circuit. The control grid of the vacuum tube is also connected to ground through the parallel combination of one of the plurality of resistors 16 and a variable capacitor 17. Switch 18 selects which one of resistors 16 is in the circuit. The movable contact of switch 18 is connected to the movable contact of a potentiometer 19 whose other terminals are connected across the auxiliary voltage source 10. The position of the movable contact of the potentiometer controls the bias voltage between grid and cathode of vacuum tube 1. This setting is preferably adjusted such that the D.-C. potential across thermistor 12 is zero, so that the current through the thermistor, and hence its stabilization qualities, is determined only by the A.-C. voltage fed back to the vacuum tube. The movable contact of potentiometer 19 is bypassed to ground by a capacitor 20.

As is conventional in R-C oscillators, capacitors 14 and 17 are ganged together and adjustable in capacity from a low value for high frequency to a high value for low frequency. Similarly, switches 15 and 18 are ganged together and function to determine the ranges of variation of frequency of the oscillator. It is conventional in such oscillators to have the capacitors 14 and 17 of equal value and to have the resistors 13 and 16 also of equal value. In such case, the frequency of output of the oscillator is equal to the reciprocal of the product of the capacity of one of the capacitors and the resistance of one of the resistors 13 and 16 in the circuit at that time.

With the circuit described above, it has been found possible to obtain a frequency range from one cycle to at least two megacycles. For such a range, the lowest value resistor is of the order of 3600 ohms, while the highest value resistor is of the order of 360 megohms. The capacitors then may have maximum capacities of 365 micro-micro-farads and have a minimum capacity of the order of 30 micro-micro-farads.

For the purpose of illustration only, and not as a limitation of the scope of the invention, representative values of the other components in the circuit will now be given:

| | | |
|---|---|---|
| $R_3$ | ohms | 1,000 |
| $V_4$ | volts | 13½ |
| $R_5$ | ohms | 470 |
| $V_6$ | volts | 1.5 |
| $R_7$ | ohms | 27 |
| $R_9$ | do | 3,300 |
| $V_{10}$ | volts | 9 |
| $R_{11'}$ | ohms | 12,000 |
| $R_{19}$ | do | 100,000 |

While an electrometer type tube has been employed in the preferred embodiment of the invention, such a tube is not essential to operation of this invention. It is necessary, however, that the grid current of the input tube be of a very small magnitude, of the order of $10^{-12}$ amperes, so that a very large resistor may be used in the grid-cathode circuit of the tube for low frequency operation. The combination of the vacuum tube with very low transductance and extremely low grid current, and a directly-coupled transistor, enables applicants to obtain an extremely wide range of frequencies from the oscillator, since the input tube can be used as a voltage to current transducer, and the necessary gain of the amplifier can be obtained from the transistor. The tube can furnish a gain of unity or less, since the transistor gain can make up for any loss of gain in the vacuum tube.

The electrometer tube is used primarily because its plate characteristic is such that it is possible to operate the grid at a voltage of −3 to −4 volts, with a plate voltage of the order of only 10 to 12 volts. Further, a low plate resistor of the order of 1,000 ohms can be employed, since the input impedance of the tube and hence the grid current is so low. Tubes other than the electrometer type might require as much as 30 or 40 volts of plate voltage to achieve the same grid conditions.

It will be evident that transistor 11 of Fig. 1 is not absolutely essential to operation of the oscillator. As a matter of fact, the output of the oscillator could be obtained from the collector circuit of transistor 2, and the thermistor 12 could be connected directly to this collector.

Figure 2:
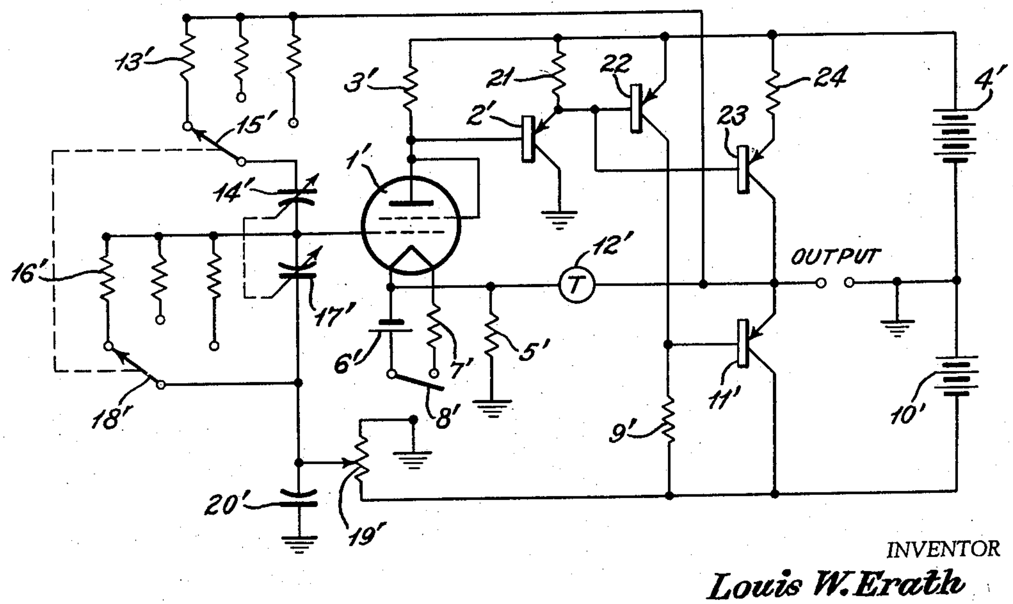
Fig. 2 is a schematic diagram of the modification of the apparatus of Fig. 1, employing a class B amplifier, coupled to the output of the combination vacuum tube and transistor of the invention.

Since radio frequency transistors are used in the circuit of Fig. 1, and since such transistors have the characteristic of very small power dissipation, it is preferred to employ additional transistor stages to reduce the total dissipation of each transistor below the rated value and to increase the drive to the feedback thermistor 12. The apparatus of Fig. 2 is intended to accomplish these objectives. In that figure, similar components to those of Fig. 1 are identified with the same reference numerals primed.

In the apparatus of Fig. 2, the output of transistor 2' is developed across a resistor 21 in its emitter circuit, and the collector is connected directly to ground. The emitter of transistor 2' is conductively connected to the base of each of PNP transistors 22 and 23. The emitter of transistor 22 is connected to the positive side of the plate source 4', while the emitter of transistor 23 is connected through a resistor 24 to the same point. The collector of transistor 22 is connected to the base of transistor 11' and through resistor 9' to the negative terminal of auxiliary source 10'. The collector of transistor 23 and the emitter of transistor 11' are connected together and form one terminal of the output of the oscillator. Resistor 24 in the emitter circuit of transistor 23 provides bias for the transistor and prevents run-away of this stage. Transistor 2' functions as an emitter-follower between the electrometer tube 1' and transistor 22 to provide a low impedance drive to transistor 22.

As will be evident, transistors 11' and 23 function as a class B output stage to provide almost twice the output available from the transistor 11 of Fig. 1. Transistors 11' and 23 provide alternate half cycles of the sine wave of current applied to the base of transistor 2'. Resistor 24 in the emitter circuit of transistor 23 operates to balance the half cycles of current provided by these two transistors. This resistor could have been used in the emitter circuit of transistor 22 if its gain had been greater than that of transistor 23.

Since the apparatus of Fig. 2 is otherwise identical with that of Fig. 1, the other components of the oscillator of Fig. 2 will not be further described, nor will the values of the component be given.

The preferred embodiments of the invention herein described involve the application of the invention to the so-called R-C oscillator of the Hewlett type. As indicated above, the invention could be employed with oscillators of other types, such as that disclosed in the Scott patent referred to above and in the Erath article referred to above. Moreover, many minor changes could obviously be made in the preferred embodiments without departure from the scope of the invention. Therefore, the invention should not be considered limited to the embodiments disclosed, but only by the scope of the appended claims.

I claim:

1. An oscillator comprising a vacuum tube having an anode, a cathode and a control grid, a source of plate voltage, a plate resistor connected between said anode and the positive side of said source, means connecting the negative side of the source to said cathode, said tube and the parameters of its circuits being so chosen that the grid current in said tube is of the order of $10^{-12}$ amperes, a PNP junction transistor having its base connected to the anode of said tube and its emitter connected to the positive side of said source, an output circuit connected to the emitter-collector circuit of said transistor, and a frequency-selective feedback circuit connected between said output circuit and the grid-cathode circuit of said tube and operable to furnish regenerative feedback to cause oscillations at the frequency selected by said feedback circuit.

2. An oscillator as defined in claim 1 including a second feedback circuit connected between said output circuit and the grid-cathode circuit of said tube operable to furnish degenerative feedback thereto.

3. The apparatus of claim 2 in which said second feedback circuit includes a thermistor.

4. The apparatus of claim 1 in which said feedback circuit includes the series combination of a resistor and a capacitor connected between said output circuit and the grid of said tube and the parallel combination of a resistor and a capacitor connected between grid and cathode of said tube.

5. The apparatus of claim 4 in which said capacitors are variable and ganged together, and including a thermistor connected between said output circuit and the cathode of said tube to furnish degenerative feedback thereto.

6. The apparatus of claim 1 in which said output circuit includes a second PNP junction transistor having its base connected to the collector of said first-mentioned transistor, the output of said oscillator being available between the emitter and collector of said second transistor.

7. The apparatus of claim 6 including a thermistor connected between the emitter of said second transistor and the cathode of said tube.

8. The apparatus of claim 7 in which said tube is of the electrometer type.

9. An R–C oscillator comprising an electrometer tube having an anode, a cathode and a control grid, a source of plate voltage, a plate resistor connected between said anode and the positive side of said source, means connecting the negative side of the source of said cathode, said tube and the parameters of its circuits being so chosen that the grid current in said tube is of the order of $10^{-12}$ amperes, a PNP junction transistor having its base connected to the anode of said tube and its emitter connected to the positive side of said source, an output circuit connected to the emitter-collector circuit of said transistor, and a pair of feedback circuits connected between said output circuit and the grid-cathode circuit of said tube, one of said feedback circuits being regenerative in effect and comprising the series combination of a first resistor and a first capacitor connected between said output circuit and the grid of said tube and the parallel combination of a second resistor and a second capacitor connected between grid and cathode of said tube, the other feedback circuit being degenerative in effect and including a thermistor connected between said output circuit and the cathode of said tube.

10. The apparatus of claim 9 including means for adjusting the grid-cathode bias of said tube to such value that the D.-C. potential across said thermistor is substantially zero.

11. An oscillator comprising a vacuum tube having an anode, a cathode and a control grid, a source of plate voltage, a plate resistor connected between said anode and the positive side of said source, means connecting the negative side of the source to said cathode, said tube and the parameters of said circuits being so chosen that the grid current in said tube is of the order of $10^{-12}$ amperes, a PNP junction transistor having its base connected to the anode of said tube and its emitter connected to the positive side of said source, a class B amplifier circuit connected to the emitter-collector circuit of said transistor, the output of said oscillator being available at the output of said amplifier, and a frequency-selective feedback circuit connected between the output of said amplifier and the grid-cathode circuit of said tube and operable to furnish regenerative feedback to cause oscillations at the frequency selected by said feedback circuit.

12. The apparatus of claim 11 in which said amplifier includs three PNP junction transistors, the first and second of said transistors having their bases connected to the emitter of said first-mentioned transistor, the emitter of both said first and second transistors being connected to the positive side of said source, the collector of said first transistor being connected to the base of the third of said transistors, and the collector of the second transistor and the emitter of the third transistor being connected together and the output of the amplifier being available at that connection.

13. The apparatus of claim 12 including a thermistor connected between the cathode of said tube and the connection between the collector of the second transistor and the emitter of the third transistor.

14. The apparatus of claim 13 including means for adjusting the grid-cathode bias of said tube to such value that the D.-C. potential across said thermistor is substantially zero.

No references cited.